United States Patent
Huynh

(10) Patent No.: US 8,687,739 B1
(45) Date of Patent: Apr. 1, 2014

(54) QUADRATURE BANDPASS-SAMPLING RF RECEIVER

(71) Applicant: Phuong Thu-Minh Huynh, Fairfax, VA (US)

(72) Inventor: Phuong Thu-Minh Huynh, Fairfax, VA (US)

(73) Assignee: Phuong Huynh, Fairfax, VA (US)

( * ) Notice: Subject to any disclaimer, the term of this patent is extended or adjusted under 35 U.S.C. 154(b) by 0 days.

(21) Appl. No.: 13/711,665

(22) Filed: Dec. 12, 2012

(51) Int. Cl.
*H04L 27/00* (2006.01)

(52) U.S. Cl.
USPC .......................................................... 375/326

(58) Field of Classification Search
CPC .. H04L 27/34; H04L 27/0014; H04L 27/2657
USPC .......................................................... 375/326
See application file for complete search history.

(56) References Cited

U.S. PATENT DOCUMENTS

| | | | | |
|---|---|---|---|---|
| 5,841,388 A | * | 11/1998 | Yasuda et al. | 341/155 |
| 6,275,540 B1 | * | 8/2001 | Barrett et al. | 375/316 |
| 6,459,743 B1 | * | 10/2002 | Lipka | 375/329 |
| 6,639,939 B1 | * | 10/2003 | Naden et al. | 375/140 |
| 8,565,345 B2 | * | 10/2013 | Gupta | 375/299 |
| 2004/0242177 A1 | * | 12/2004 | Yang | 455/234.1 |
| 2005/0117663 A1 | * | 6/2005 | Drogi et al. | 375/316 |
| 2005/0119025 A1 | * | 6/2005 | Mohindra et al. | 455/552.1 |
| 2006/0007929 A1 | * | 1/2006 | Desai et al. | 370/389 |
| 2008/0025437 A1 | * | 1/2008 | Huynh | 375/324 |
| 2008/0261650 A1 | * | 10/2008 | Piriyapoksombut et al. | 455/552.1 |

* cited by examiner

*Primary Examiner* — Juan A Torres

(57) ABSTRACT

A quadrature bandpass-sampling radio frequency (RF) receiver is provided. The receiver bandpass-samples and quantizes an RF signal to provide an in-phase bi-level digital signal based on an in-phase clock and a quadrature bi-level digital signal based on a quadrature clock. The in-phase clock frequency and the quadrature clock frequency are equal to the RF signal carrier frequency. The quadrature clock is ninety degree out of phase with respect to the in-phase clock.

4 Claims, 5 Drawing Sheets

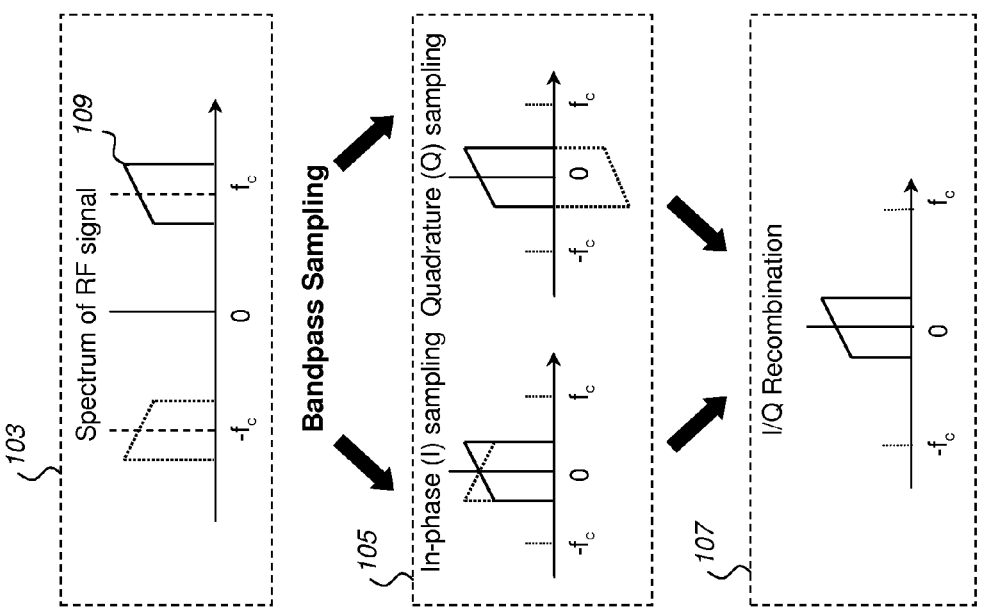

QUADRATURE BANDPASS-SAMPLING RF RECEIVER

FIELD OF THE INVENTION

The present invention relates in general to analog-to-digital conversion in communication systems. More specifically, the invention relates to analog-to-digital demodulation of a signal at radio frequencies in a communication system using bandpass sampling and delta-sigma modulation.

BACKGROUND OF THE INVENTION

Wireless systems are becoming a fundamental mode of telecommunication in modern society. In order for wireless systems to continue to penetrate into the telecommunications market, the cost of providing the service must continue to decrease and the convenience of using the service should continue to increase. In response to increasing market demand, radio standards around the world have been proliferated based upon digital modulation schemes. Consequently, it is often advantageous to have a receiver that is capable of communication using more than one of these standardized techniques. In order to do so, it is necessary to have a receiver that is capable of receiving signals that have been modulated according to several different modulation techniques.

Existing receivers are implemented using double conversion (or heterodyne) receiver architectures. A double conversion receiver architecture is characterized in that a received radio-frequency (RF) signal is converted to an intermediate frequency (IF) signal, which is subsequently converted to baseband. In addition, gain control is also typically applied at the IF. However, double conversion receivers have the disadvantage of utilizing a great number of analog circuit components, thus, increasing the cost, size, and power consumption of the receiver.

A direct conversion receiver, also sometimes called a zero-IF receiver, provides an alternative to the traditional double down conversion architecture. This is particularly attractive for the use in wireless systems, especially in handsets, since direct conversion receivers lend themselves more easily to monolithic integration than heterodyne architectures. Also, direct conversion exhibits immunity to the problem of image since there is no IF.

However, there exist design issues associated with the direct conversion architecture. The most serious problem is a direct current (DC) offset in the baseband, which appears in the middle of the down-converted signal spectrum, and may be larger than the signal itself. This phenomenon is caused by local oscillator leakage and self-mixing. Furthermore, mismatch between the in-phase (I) component and the quadrature (Q) component, occurring in the quadrature down-conversion, can lead to corrupted signal constellation, thereby increasing the number of bits in error, due to the differences which may occur in the I and Q signal amplitudes and phases.

Advancement in semiconductor process technologies allows usage of oversampling bandpass delta-sigma analog-to-digital conversion in the RF frequencies, which is a new promising low-cost and reliable technique to digitize RF signals. The delta-sigma converter comprises a bandpass filter, which consists of a series of resonators in cascade, an analog-to-digital converter (A/D), that generates the converted digital output signal, and a digital-to-analog converter (D/A) that produces a plurality of analog signals converted from the digital output signal to be feed back to the resonator inputs. The first error signal is produced by the difference between the input RF signal and the first feedback signal from the D/A. A first resonator in the filter stage amplifies the first error signal to produce a more refined error signal, which is subtracted from a second feedback signal from the D/A. The sequence is repeated down the resonator stages. The output error signal from the last resonator in the bandpass filter is then sampled by the A/D. The digitized signal is converted to a feedback signal via the D/A. In order to achieve feedback stability, the sampling frequency of the A/D must be at least four times the RF signal frequency, and the digital output reproduces the high-frequency waveform of the input RF signal.

Nevertheless, oversampling an RF signal is not quite practical given the current advancement in process technologies, where the sampling clock rate may exceed tens of gigahertz. The inherent clock jitter in the sampling clock to the A/D, due to thermal agitation at the molecule level that generates phase noise in clock oscillators, severely limits the analog-to-digital conversion resolution. Also, pre-processing of the digitized RF signal requires an impractically high clock rate in the tens of gigahertz range.

SUMMARY OF THE INVENTION

The invention features a circuit for demodulating an RF signal to baseband comprising: a single-bit analog-to-digital (A/D) demodulator, having an input conversion bandwidth, configured to receive an RF signal, having an RF carrier frequency, quantize the RF signal based on the in-phase sampling clock to generate an in-phase digital signal, and quantize the RF signal based on the quadrature sampling clock to generate a quadrature digital signal; a sampling clock generator configured to generate an in-phase sampling clock, having an in-phase sampling clock frequency, and a quadrature sampling clock, having a quadrature sampling clock frequency; wherein the RF carrier frequency being between 0.5 GHz to 6 GHz, the input conversion bandwidth being more than 5 MHz and less than 100 MHz, the center frequency of the input conversion bandwidth being equal to the RF carrier frequency, both the in-phase sampling clock frequency and the quadrature sampling clock frequency being equal to the RF carrier frequency, the quadrature sampling clock being ninety degree out of phase with respect to the in-phase sampling clock, and both in-phase digital signal and the quadrature digital signal being bi-level digital signals.

The single-bit A/D demodulator further comprises: first through $(K-1)^{th}$ summers, the $i^{th}$ summer being configured to receive the $i^{th}$ in-phase analog signal, the $i^{th}$ quadrature analog signal and the $(i+1)^{th}$ amplified error signal, generate an $i^{th}$ error signal, $i^{th}$ being from first through $(K-1)^{th}$; a $K^{th}$ summer configured to receive an input RF signal and the $K^{th}$ in-phase and quadrature analog signals, generate a $K^{th}$ error signal; first through $K^{th}$ resonators, the $i^{th}$ resonator being configured to receive the $i^{th}$ error signal, generate an $i^{th}$ amplified error signal, $i^{th}$ being from first through $K^{th}$; a first quantizer configured to receive the first amplified error signal based on the in-phase sampling clock, and generate an in-phase digital signal; a second quantizer configured to receive the first amplified error signal based on the quadrature sampling clock, and generate a quadrature digital signal; first through $K^{th}$ in-phase digital multipliers configured to multiply the in-phase digital signal with the in-phase sampling clock to generate first through $K^{th}$ up-converted in-phase signals; first through $K^{th}$ quadrature digital multipliers configured to multiply the quadrature digital signal with the quadrature sampling clock to generate first through $K^{th}$ up-converted quadrature signals; first through $K^{th}$ in-phase D/A converters configured to receive the first through $K^{th}$ up-converted in-phase signals, and generate first through $K^{th}$ in-phase analog signals; first through $K^{th}$ quadrature D/A converters configured to receive the first through $K^{th}$ up-converted quadrature signals, and generate first through $K^{th}$ quadrature analog signals; wherein first through $K^{th}$ in-phase and quadrature D/A converters being single-bit converters, and wherein K is between 2 and 4.

The invention also features a method for demodulating an RF signal to baseband comprising: receiving an RF signal, having an RF carrier frequency; quantizing the RF signal based on the in-phase sampling clock to generate an in-phase digital signal, and based on the quadrature sampling clock to generate a quadrature digital signal, the quantizing being restricted to an input conversion bandwidth; generating an in-phase sampling clock, having an in-phase sampling clock frequency; generating a quadrature sampling clock, having a quadrature sampling clock frequency; wherein the RF carrier frequency being between 0.5 GHz to 6 GHz, the input conversion bandwidth being more than 5 MHz and less than 100 MHz, the center frequency of the input conversion bandwidth being equal to the RF carrier frequency, both the in-phase sampling clock frequency and the quadrature sampling clock frequency being equal to the RF carrier frequency, the quadrature sampling clock being ninety degree out of phase with respect to the in-phase sampling clock, and both in-phase digital signal and the quadrature digital signal being bi-level digital signals.

The quantizing of the RF signal further comprises combining first through $(K-1)^{th}$ in-phase analog signals, first through $(K-1)^{th}$ quadrature analog signals and second through $K^{th}$ amplified error signals to generate first through $(K-1)^{th}$ error signals, respectively; combining the $K^{th}$ in-phase and quadrature analog signals to generate a $K^{th}$ error signal; amplifying first through $K^{th}$ error signals to generate first through $K^{th}$ amplified error signals; quantizing the first amplified error signal based on the in-phase sampling clock to generate an in-phase digital signal, and based on the quadrature sampling clock to generate a quadrature digital signal; generating first through $K^{th}$ up-converted in-phase signals based on first through $K^{th}$ multiplications of the in-phase digital signal with the in-phase sampling clock; generating first through $K^{th}$ up-converted quadrature signals based on first through $K^{th}$ multiplications of the quadrature digital signal with the quadrature sampling clock; D/A converting first through $K^{th}$ up-converted in-phase signals to generate first through $K^{th}$ in-phase analog signals; D/A converting first through $K^{th}$ up-converted quadrature signals to generate first through $K^{th}$ quadrature analog signals; wherein D/A converting being a single-bit conversion; and wherein K is between 2 and 4.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

FIG. 1A is a frequency diagram illustrating quadrature down conversion to baseband based on the bandpass-sampling theory;

DETAILED DESCRIPTION

Figure 1B:
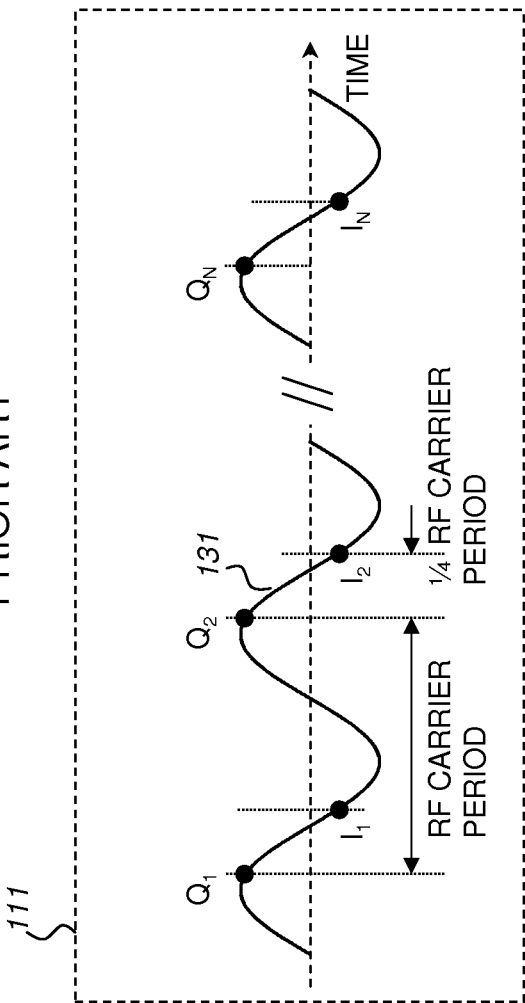
FIG. 1B is a timing diagram illustrating quadrature down conversion to baseband based on the bandpass-sampling theory.

In overview, the present disclosure concerns electronic devices or units, some of which are referred to as communication units, such as cellular phone or two-way radios and the like, typically having a capability for rapidly handling data, such as can be associated with a communication system such as an Enterprise Network, a cellular Radio Access Network, or the like. More particularly, various inventive concepts and principles are embodied in circuits, and methods therein for receiving signals in connection with a communication unit.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with in integrated circuits (ICs), such as a digital signal processor or application specific ICs. It is expected that one of ordinary skill, notwithstanding possibly significant effort and many design choices motivated by, for example, available time, current technology, and economic considerations, when guided by the concepts and principles disclosed herein will be readily capable of generating ICs with minimal experimentation. Therefore, in the interest of brevity and minimization of any risk of obscuring the principles and concepts according to the present invention, further discussion of such ICs, if any, will be limited to the essentials with respect to the principles and concepts used by the exemplary embodiments.

Referring now to FIG. 1A, frequency diagrams 103, 105, and 107 illustrate quadrature down conversion of an RF signal to the baseband frequency based on the bandpass-sampling theory. A communication transmitter is employed to modulate the information to a carrier frequency, $f_C$, and transmit the RF signal over the air. For example, conventional cellular phone carrier frequencies are currently set at either 900 MHz or 1800 MHz. In quadrature modulation, two independent data streams, A(t) and B(t), are modulated by $\cos(w_c t)$ and $\sin(w_c t)$, respectively. The combined A(t) $\cos(w_c t)$−B(t) $\sin(w_c t)$ is then transmitted over the air. In the frequency domain, the transmitted information 109 in the frequency diagram 103 can be seen centered at the carrier frequency, $f_C$, where the width of the shaped object corresponds to the bandwidth of the transmitted information. Note that the transmitted object is mirrored to the negative frequencies along the zero-frequency axis.

Referring now to FIG. 1B, the timing diagram 111 illustrating a sinusoidal waveform 131 at the RF carrier frequency is provided. The in-phase, A(t), and quadrature, B(t) signals which carry the communicating information modulate slowly the amplitude and/or the phase of the sinusoidal waveform 131, depending on the modulation scheme employed in the communication system. In a quadrature bandpass-sampling receiver, the sampling rate is set equal to the RF carrier frequency, $f_C$, and only two respective sampled data points for every period of the RF carrier are captured, as shown in the timing diagram 111. The first sequence of sampled data points $I_1, I_2, \ldots, I_N$ corresponds to the in-phase (I) sequence while the second sequence of sampled data points $Q_1, Q_2, \ldots, Q_N$ corresponds to the quadrature (Q) sequence. Note that the time duration in between two adjacent sampled points of each sequence is always, $$\frac{1}{f_C},$$

the RF carrier period, and the time duration between a Q sampled point and an adjacent I sampled point is always, $$\frac{1}{4f_C},$$

or one quarter of the RF carrier period.

Bandpass sampling the sinusoidal waveform 131 removes the high frequency RF waveform and captures only the slowly-varying amplitude and/or phase of the communicating information that were modulated to the RF carrier frequency. By virtue of the bandpass sampling theory, the in-phase and quadrature modulated signals are down-converted to baseband, or dc, as illustrated in the frequency diagram 105 of FIG. 1A. The sampled I and Q sequences can be recombined, according to I±jQ (where j denotes the imaginary complex number notation), to re-construct the transmitted A(t) and B(t) signals as in the frequency diagram 107.

However, conventional technologies currently can not provide a sample/hold or an A/D converter that can sample an RF signal in the gigahertz frequencies and produce a demodulated signal with a resolution higher than 9 bits—a resolution that is far below wireless standard requirements for RF receivers. In the following disclosed embodiments, a novel bandpass sampling technique is provided and discussed to illustrate high-resolution quantization and demodulation of RF signals.

Figure 2:
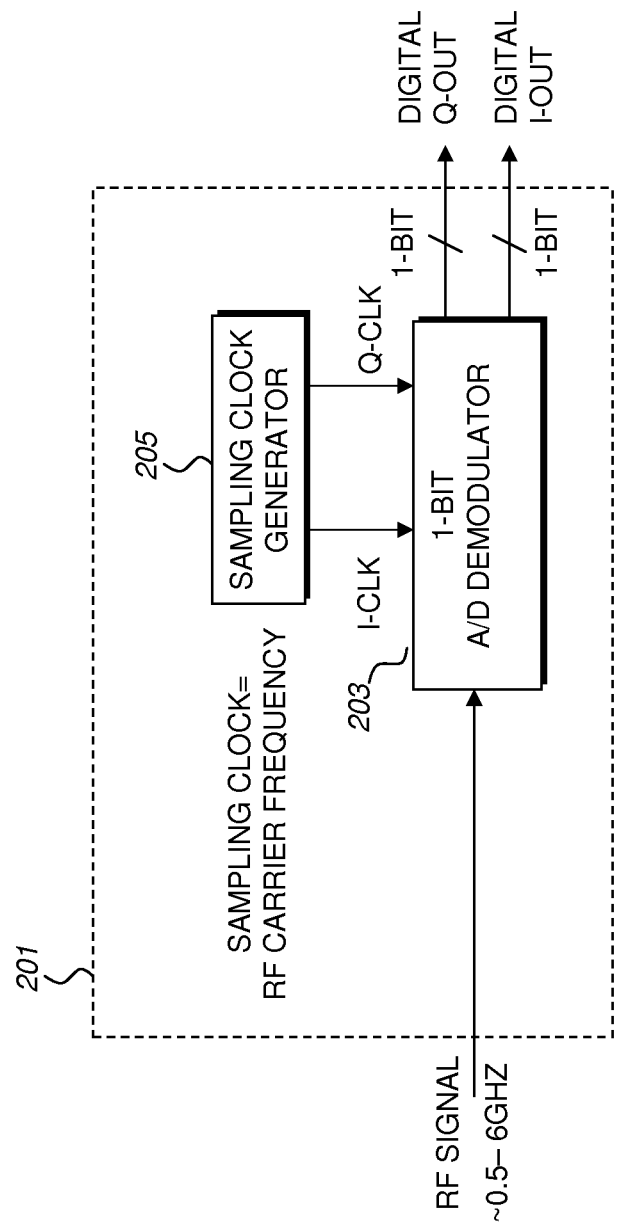
FIG. 2 is a schematic diagram illustrating an exemplary quadrature bandpass sampling receiver, according to disclosed embodiments.

Referring now to FIG. 2, a schematic diagram illustrating a quadrature bandpass sampling receiver 201 is discussed. The quadrature bandpass sampling receiver 201 comprises a sampling clock generator 205, and a single-bit A/D demodulator 203. The sampling clock generator 205 generates an in-phase sampling clock (I-CLK) and a quadrature sampling clock (Q-CLK). The in-phase sampling clock frequency and the quadrature sampling clock frequency are set equal to the carrier frequency of the input RF signal. The quadrature sampling clock Q-CLK is 90-degree out-of-phase with respect to the in-phase sampling clock I-CLK. The RF signal, whose center frequency is located between 0.5 GHz and 6 GHz, is bandpass-sampled and demodulated by the single-bit A/D demodulator 203 based on I-CLK to produce a digital I-OUT signal, and based on Q-CLK to produce a digital Q-OUT signal.

Both digital I-OUT and Q-OUT signals are bi-level signals, having only one bit of resolution. However, because the I-OUT and Q-OUT signals are clocked at a sampling rate equal to the RF signal carrier frequency, and the transmitted baseband signals A(t) and B(t) have bandwidths of only a few or tens of megahertz, it is possible to use the oversampling technique to noise-shape the quantization noise in the I-OUT and Q-OUT signals. This oversampling technique is often used in delta-sigma modulators, in which the quantization noise is pushed out to the high frequency range, leaving the signal band near dc having very low level of quantization noise.

Figure 3:
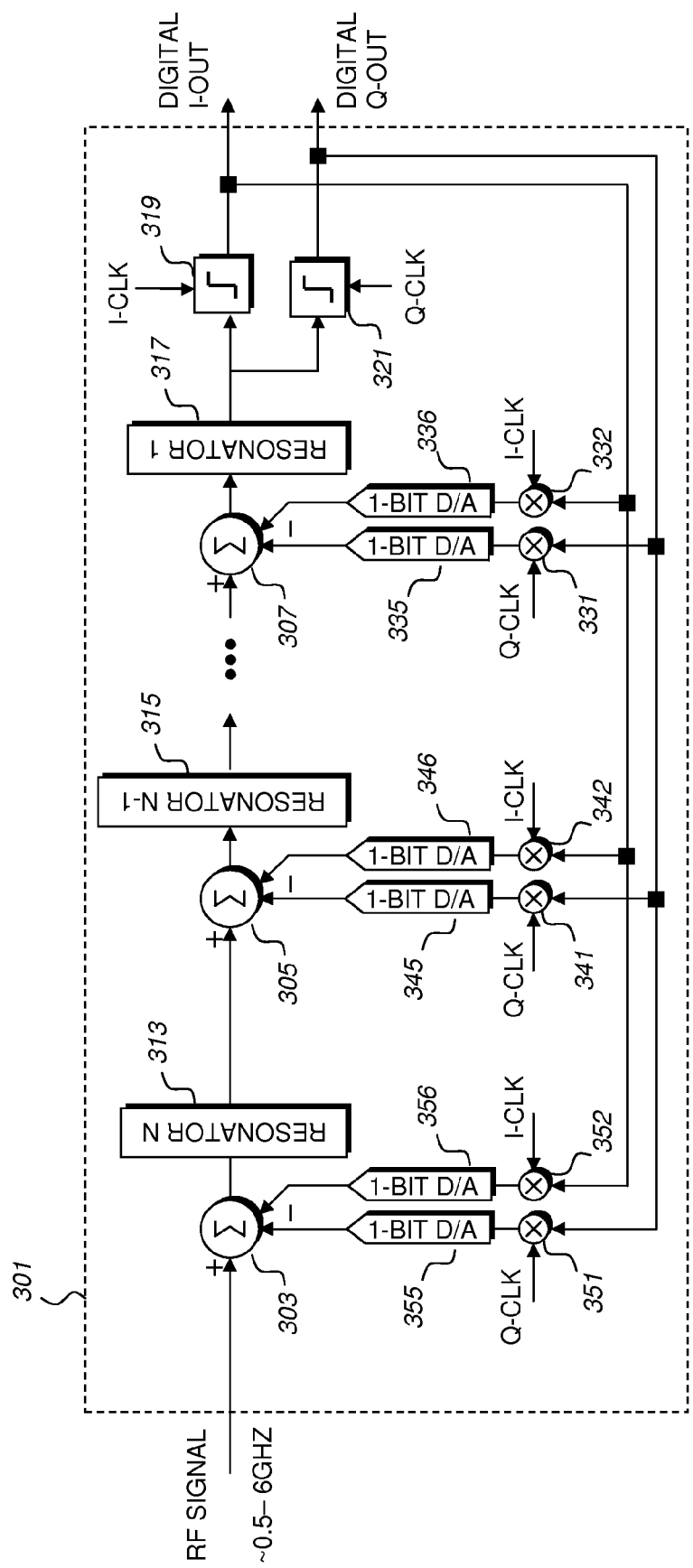
FIG. 3 is a schematic diagram illustrating an exemplary quadrature bandpass sampling delta-sigma analog-to-digital demodulator (QBS-ADD), according to disclosed embodiments.

Referring now to FIG. 3, a schematic diagram 301 illustrating an exemplary quadrature bandpass sampling delta-sigma analog-to-digital demodulator (QBS-ADD) will be discussed and described. The QBS-ADD architecture 301 represents the single-bit A/D demodulator 203 in FIG. 2 and comprises a first through $N^{th}$ resonators connected in cascade, including a first resonator 317, an $(N-1)^{th}$ resonator 315 and an $N^{th}$ resonator 313; a first quantizer 319 and a second quantizer 321; a first through $N^{th}$ summers, including a first summer 307, an $(N-1)^{th}$ summer 305 and an $N^{th}$ summer 303; a plurality of single-bit digital-to-analog converters (D/A) 335, 336, 345, 346, 355, 356; and a plurality of digital multipliers 331, 332, 341, 342, 351, and 352.

In general, the QBS-ADD 301 architecture is a multi-stage feedback architecture, in which the feedback tap points are provided by the pair D/As (355, 356), (345, 346) and (335, 336). The resonators 313, 315 and 317 form a high-gain composite bandpass filter which provides bandpass filtering and amplification of the error signals produced by the summers 303, 305, and 307, respectively. The $N^{th}$ summer 303 subtracts the feedback information from the D/As 355 and 356 from the RF signal to produce an $N^{th}$ error signal, which is bandpass filtered and amplified by the $N^{th}$ resonator 313. Next, the $(N-1)^{th}$ summer 305 subtracts the feedback information from the D/As 345 and 346 from the amplified $N^{th}$ error signal at the output of the $N^{th}$ resonator 313 to produce an $(N-1)^{th}$ error signal. The $(N-1)^{th}$ error signal is then bandpass filtered and amplified by the $(N-1)^{th}$ resonator 315. The process continues until the first error signal being bandpass filtered and amplified by the first resonator 317.

The single-bit quantizers 319 and 321 provide bandpass sampling and down-conversion of the RF signal to baseband. The first quantizer 319 and the second quantizer 321 are clocked by the in-phase sampling clock, I-CLK, and the quadrature sampling clock, Q-CLK, respectively. The first quantizer 319 generates the bi-level digital output, I-OUT, which contains the in-phase component down-converted to baseband. The second quantizer 321 generates the bi-level digital output, Q-OUT, which contains the quadrature component down-converted to baseband.

Because the RF signal is demodulated to baseband by the quantizers 319 and 321, by virtue of the bandpass sampling theory, it is fundamentally necessary to up-convert the demodulated signals, I-OUT and Q-OUT, as feedback signals to fulfill the feedback requirement—i.e. the feedback signals must be modulated by the same frequency as the input RF signal so that the correct error signals can be generated at the summers 303, 305 and 307. This requirement dictates inclusion of the feedback multipliers 331, 341, 351 to up-convert the Q-OUT signal using Q-CLK, and the feedback multipliers 332, 342 and 352 to up-convert the I-OUT signal using I-CLK to the RF signal carrier frequency. Since I-CLK, Q-CLK, I-OUT, and Q-OUT are all bi-level signals, the multipliers 331, 332, 341, 342, 351, and 352 are single-bit multiplication. Consequently, only single-bit D/As 335, 336, 345, 346, 355, and 356 are needed.

The addition of the single-bit feedback multipliers 331, 341, 351, 332, 342, and 352 in the feedback path set apart a novel QBS-ADD 301 that allows bandpass-sampling at the RF frequency, which is fundamentally different from the conventional delta-sigma A/Ds, as the later requires sampling clocks at least four times higher than the RF signal frequency.

Each resonator can be constructed from an inductor, L, and a capacitor, C, both of which form a resonance at $$\frac{1}{\sqrt{LC}}.$$

Each resonator is required to have a high quality factor (Q-factor) to produce the high gain required for signal amplification. All the resonators 313, 315, and 317 resonant frequencies are set close to each other to form a bandpass filter with the passband centered about the RF signal carrier frequency. The spacings between resonant frequencies are about 5 MHz to 10 MHz. The order of a bandpass delta-sigma modulator relates to the number of resonators, or more exactly the number of Ls and Cs. For example, a second-order bandpass delta-sigma modulator comprises one LC resonator, or one L and one C; whereas an eighth-order modulator comprises four LC resonators. High-order bandpass delta-sigma modulators are characterized by excessive phase shifts in the bandpass filter, and therefore, are difficult to stabilize due to their feedback characteristic. Nevertheless, fourth-order to eighth-order modulators can be stabilized easily and are adequate to achieve high-resolution A/D quantization to meet various current wireless standard requirements.

Figure 4:
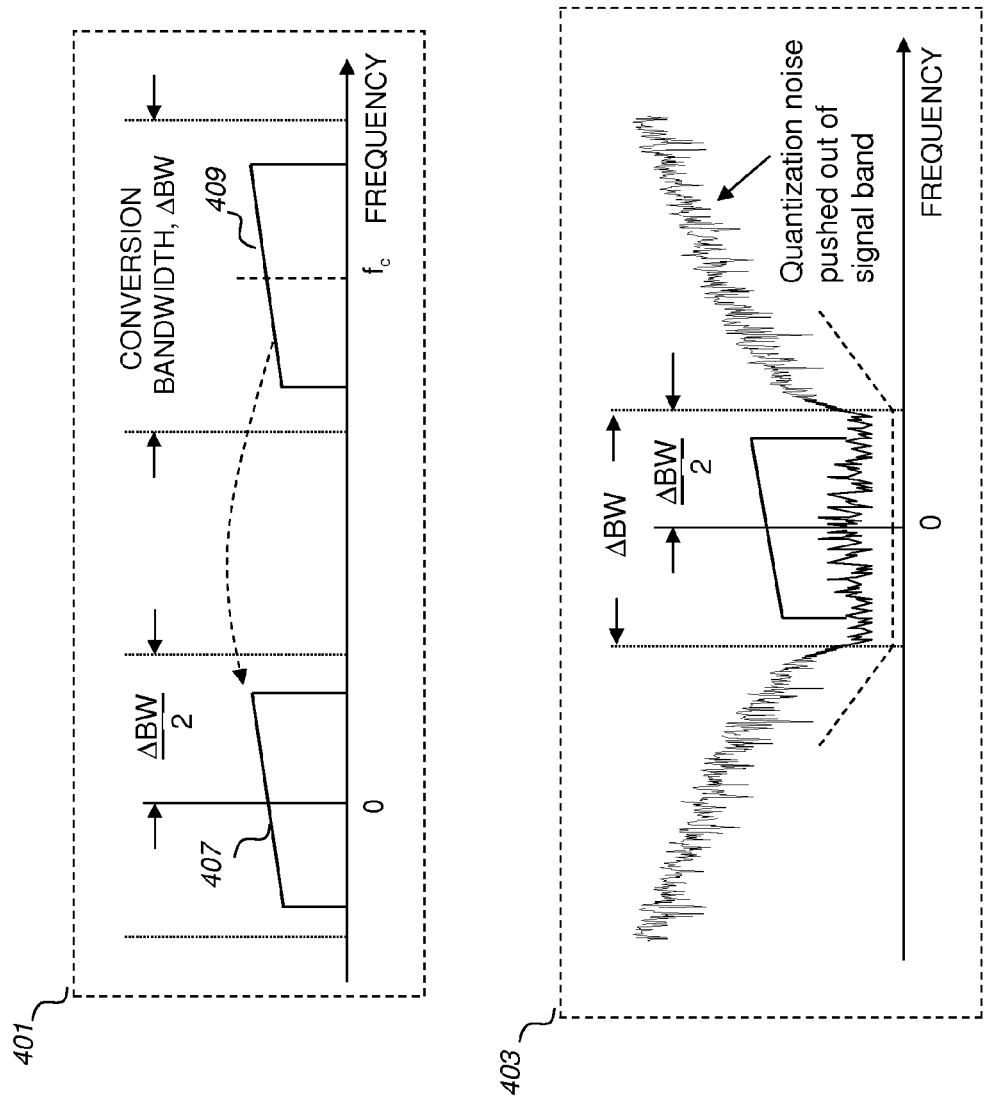
FIG. 4 is a frequency diagram illustrating RF signal demodulation and quantization noise-shaping.

In FIG. 4, the frequency diagrams 401 and 403 illustrate the down-conversion of the RF signal and the spectrum profile of the QBS-ADD 301 outputs, after I/Q recombination. In the frequency diagram 401, the concepts of input conversion bandwidth of the QBS-ADD 301 is illustrated. The input conversion bandwidth, $\Delta BW$, is defined as the frequency range within which an RF signal can be demodulated to baseband and effectively quantized to yield high-resolution in-phase and quadrature baseband signals. The input RF signal 409 is centered at the RF carrier frequency, $f_c$ (note that the negative frequency component is not shown in the frequency diagram 401 for clarity purpose). The center frequency of $\Delta BW$ is also equal to $f_c$. Therefore, for the RF signal 409 to be effectively quantized and demodulated, its total bandwidth, defined as the frequency width of the element 409, must be smaller than $\Delta BW$. After down conversion to baseband, the complex (I−jQ) recombination of the in-phase (I) component I-OUT and the quadrature (Q) component Q-OUT produces the baseband signal 407. The pass-band bandwidth of the composite bandpass filter formed by the resonators 313, 315 and 317 determines the input conversion bandwidth $\Delta BW$ of the QBS-ADD 301, which is usually set between 5 MHz to 100 MHz.

Unlike other conventional RF receivers where the in-phase and quadrature demodulated signals are digitized by a pair of high-resolution A/Ds at a low sampling rate, the QBS-ADD 301 is a delta-sigma type converter, which produces a stream of bi-level digital I-OUT and Q-OUT signals clocked at a sample rate equal to the RF signal carrier frequency. The frequency diagram 403 illustrates a typical spectrum profile of the combined I−jQ (where j is the imaginary complex number) from the I-OUT and Q-OUT signals. Even though I-OUT and Q-OUT exhibit noise-like characteristics, the noise-shaping property of oversampling delta-sigma modulators pushes the quantization noise to higher frequencies and leaves the signal band at baseband, between $$-\frac{\Delta BW}{2} \text{ and } \frac{\Delta BW}{2},$$

with a minimum amount of quantization noise. It is seen then that the frequency band from $$-\frac{\Delta BW}{2} \text{ to } \frac{\Delta BW}{2},$$

within which the quantization noise is minimized, defines the input conversion bandwidth of the QBS-ADD 301; i.e. if the RF signal band falls within the input conversion bandwidth of the QBS-ADD 301, then the RF signal can be demodulated and effectively quantized to the highest resolution.

It should be noted that the term communication unit may be used herein to denote a wired device, for example a high speed modem, an xDSL type modem, a fiber optic transmission device, and the like, and a wireless device, and typically a wireless device that may be used with a public network, for example in accordance with a service agreement, or within a private network such as an enterprise network or an ad hoc network. Examples of such communication devices include a cellular handset or device, television apparatus, personal digital assistants, personal assignment pads, and personal computers equipped for wireless operation, and the like, or equivalents thereof, provided such devices are arranged and constructed for operation in connection with wired or wireless communication.

The communication units of particular interest are those providing or facilitating voice communications services or data or messaging services normally referred to as ultra wideband networks, cellular wide area networks (WANs), such as conventional two way systems and devices, various cellular phone systems including analog and digital cellular, CDMA (code division multiple access) and variants thereof, GSM (Global System for Mobile Communications), GPRS (General Packet Radio System), 2.5G and 3G systems such as UMTS (Universal Mobile Telecommunication Service) systems, Internet Protocol (IP) Wireless Wide Area Networks like 802.16, 802.20 or Flarion, integrated digital enhanced networks, LTE (Long Term Evolution) networks, and variants or evolutions thereof.

Furthermore, the wireless communication devices of interest may have short range wireless communications capability normally referred to as WLAN (wireless local area network) capabilities, such as IEEE 802.11, Bluetooth, WPAN (wireless personal area network) or Hyper-Lan and the like using, for example, CDMA, frequency hopping, OFDM (orthogonal frequency division multiplexing) or TDMA (Time Division Multiple Access) access technologies and one or more of various networking protocols, such as TCP/IP (Transmission Control Protocol/Internet Protocol), UDP/UP (Universal Datagram Protocol/Universal Protocol), IPX/SPX (Inter-Packet Exchange/Sequential Packet Exchange), Net BIOS (Network Basic Input Output System) or other protocol structures. Alternatively the wireless communication devices of interest may be connected to a LAN using protocols such as TCP/IP, UDP/UP, IPX/SPX, or Net BIOS via a hardwired interface such as a cable and/or a connector.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A circuit for demodulating an radio frequency (RF) signal to baseband comprising:
    a single-bit analog-to-digital (A/D) demodulator, having an input conversion bandwidth, configured to
        receive an RF signal, having an RF carrier frequency,
        quantize the RF signal based on the in-phase sampling clock to generate an in-phase digital signal, and
        quantize the RF signal based on the quadrature sampling clock to generate a quadrature digital signal;
    wherein the single-bit A/D demodulator further comprises:
        first through $(K-1)^{th}$ summers, the $i^{th}$ summer being configured to
            receive the $i^{th}$ in-phase analog signal, the $i^{th}$ quadrature analog signal and the $(i+1)^{th}$ amplified error signal, and
            generate an $i^{th}$ error signal, $i^{th}$ being from first through $(K-1)^{th}$;
        a $K^{th}$ summer configured to
            receive an input RF signal and the $K^{th}$ in-phase and quadrature analog signals, and
            generate a $K^{th}$ error signal;
        first through $K^{th}$ resonators, the $i^{th}$ resonator being configured to
            receive the $i^{th}$ error signal, and
            generate an $i^{th}$ amplified error signal, $i^{th}$ being from first through $K^{th}$;
        a first quantizer configured to
            receive the first amplified error signal based on the in-phase sampling clock, and
            generate an in-phase digital signal;
        a second quantizer configured to
            receive the first amplified error signal based on the quadrature sampling clock, and
            generate a quadrature digital signal;
        first through $K^{th}$ in-phase digital multipliers configured to multiply the in-phase digital signal with the in-phase sampling clock to generate first through $K^{th}$ up-converted in-phase signals;
        first through $K^{th}$ quadrature digital multipliers configured to multiply the quadrature digital signal with the quadrature sampling clock to generate first through $K^{th}$ up-converted quadrature signals;
        first through $K^{th}$ in-phase D/A converters configured to
            receive the first through $K^{th}$ up-converted in-phase signals, and
            generate first through $K^{th}$ in-phase analog signals; and
        first through $K^{th}$ quadrature D/A converters configured to
            receive the first through $K^{th}$ up-converted quadrature signals, and
            generate first through $K^{th}$ quadrature analog signals;
        wherein first through $K^{th}$ in-phase and quadrature D/A converters being single-bit converters;
    a sampling clock generator configured to generate
        an in-phase sampling clock, having an in-phase sampling clock frequency, and
        a quadrature sampling clock, having a quadrature sampling clock frequency; wherein
        the RF carrier frequency being between 0.5 GHz to 6 GHz,
        the input conversion bandwidth being more than 5 MHz and less than 100 MHz,
        the center frequency of the input conversion bandwidth being equal to the RF carrier frequency,
        both the in-phase sampling clock frequency and the quadrature sampling clock frequency being equal to the RF carrier frequency,
        the quadrature sampling clock being ninety degree out of phase with respect to the in-phase sampling clock, and
        both in-phase digital signal and the quadrature digital signal being bi-level digital signals.

2. The circuit of claim 1, wherein K is between 2 and 4.

3. A method for demodulating an radio frequency (RF) signal to baseband comprising:
    receiving an RF signal, having an RF carrier frequency;
    quantizing the RF signal
        based on the in-phase sampling clock to generate an in-phase digital signal, and
        based on the quadrature sampling clock to generate a quadrature digital signal,
        the quantizing being restricted to an input conversion bandwidth;
    wherein quantizing the RF signal further comprises:
        combining first through $(K-1)^{th}$ in-phase analog signals, first through $(K-1)^{th}$ quadrature analog signals and second through $K^{th}$ amplified error signals to generate first through $(K-1)^{th}$ error signals, respectively;
        combining the $K^{th}$ in-phase and quadrature analog signals to generate a $K^{th}$ error signal;
        amplifying first through $K^{th}$ error signals to generate first through $K^{th}$ amplified error signals;
        quantizing the first amplified error signal
            based on the in-phase sampling clock to generate an in-phase digital signal, and
            based on the quadrature sampling clock to generate a quadrature digital signal;
        generating first through $K^{th}$ up-converted in-phase signals based on first through $K^{th}$ multiplications of the in-phase digital signal with the in-phase sampling clock;
        generating first through $K^{th}$ up-converted quadrature signals based on first through $K^{th}$ multiplications of the quadrature digital signal with the quadrature sampling clock;
        D/A converting first through $K^{th}$ up-converted in-phase signals to generate first through $K^{th}$ in-phase analog signals; and D/A converting first through K$^{th}$ up-converted quadrature signals to generate first through K$^{th}$ quadrature analog signals;
wherein D/A converting being a single-bit conversion;
generating an in-phase sampling clock, having an in-phase sampling clock frequency; and
generating a quadrature sampling clock, having a quadrature sampling clock frequency;
wherein
the RF carrier frequency being between 0.5 GHz to 6 GHz,
the input conversion bandwidth being more than 5 MHz and less than 100 MHz,
the center frequency of the input conversion bandwidth being equal to the RF carrier frequency,
both the in-phase sampling clock frequency and the quadrature sampling clock frequency being equal to the RF carrier frequency,
the quadrature sampling clock being ninety degree out of phase with respect to the in-phase sampling clock, and
both in-phase digital signal and the quadrature digital signal being bi-level digital signals.

4. The method of claim 3, wherein K is between 2 and 4.

* * * * *